US008248803B2

(12) United States Patent
Lin et al.

(10) Patent No.: US 8,248,803 B2
(45) Date of Patent: Aug. 21, 2012

(54) SEMICONDUCTOR PACKAGE AND METHOD OF MANUFACTURING THE SAME

(75) Inventors: Jyh-Rong Lin, Taipei (TW); Ming Lu, Taipei (TW)

(73) Assignee: Hong Kong Applied Science and Technology Research Institute Company Limited, Shatin, New Territories (HK)

( * ) Notice: Subject to any disclaimer, the term of this patent is extended or adjusted under 35 U.S.C. 154(b) by 196 days.

(21) Appl. No.: 12/751,741

(22) Filed: Mar. 31, 2010

(65) Prior Publication Data
US 2011/0242765 A1 Oct. 6, 2011

(51) Int. Cl.
*H05K 7/20* (2006.01)

(52) U.S. Cl. ............... 361/709; 361/679.54; 361/704; 361/710; 361/719; 165/80.3; 165/104.33; 174/252; 174/255; 174/260; 174/262; 257/706; 257/712

(58) Field of Classification Search ............ 361/679.46, 361/679.47, 679.54, 702–712; 257/66, 99, 257/686, 678, 688, 706–727, 757; 174/15.1, 174/16.3, 252, 260–267; 165/80.2, 80.3, 165/104.33, 185; 29/825–852
See application file for complete search history.

(56) References Cited

U.S. PATENT DOCUMENTS

| 4,396,930 | A | * | 8/1983 | Mizutani | 257/66 |
|---|---|---|---|---|---|
| 4,628,407 | A | * | 12/1986 | August et al. | 361/711 |
| 4,924,352 | A | * | 5/1990 | Septfons | 361/709 |
| 5,189,261 | A | * | 2/1993 | Alexander et al. | 174/263 |
| 5,307,237 | A | * | 4/1994 | Walz | 361/718 |
| 5,340,947 | A | * | 8/1994 | Credle et al. | 174/262 |
| 5,590,462 | A | * | 1/1997 | Hundt et al. | 29/840 |
| 5,642,261 | A | * | 6/1997 | Bond et al. | 361/704 |
| 5,769,989 | A | * | 6/1998 | Hoffmeyer et al. | 156/94 |
| 5,933,324 | A | * | 8/1999 | Barrett | 361/703 |
| 6,190,941 | B1 | * | 2/2001 | Heinz et al. | 438/106 |
| 6,194,782 | B1 | * | 2/2001 | Katchmar | 257/738 |
| 6,282,090 | B1 | * | 8/2001 | Johnson et al. | 361/695 |
| 6,441,312 | B1 | * | 8/2002 | Tanimura et al. | 174/252 |
| 6,459,585 | B1 | * | 10/2002 | Bergstedt et al. | 361/719 |
| 6,525,942 | B2 | * | 2/2003 | Huang et al. | 361/704 |
| 6,528,882 | B2 | * | 3/2003 | Ding et al. | 257/738 |
| 6,608,379 | B2 | * | 8/2003 | Yeo et al. | 257/706 |
| 6,629,367 | B2 | * | 10/2003 | Burdon et al. | 29/852 |
| 6,730,533 | B2 | | 5/2004 | Durocher et al. | |
| 6,753,600 | B1 | * | 6/2004 | Ho | 257/698 |
| 6,929,975 | B2 | * | 8/2005 | Heinz et al. | 438/106 |
| 6,964,877 | B2 | | 11/2005 | Chen et al. | |
| 6,966,674 | B2 | | 11/2005 | Tsai | |

(Continued)

FOREIGN PATENT DOCUMENTS

CN 101392896 3/2009

(Continued)

*Primary Examiner* — Michail V Datskovskiy
(74) *Attorney, Agent, or Firm* — Hamre, Schumann, Mueller & Larson, P.C.

(57) ABSTRACT

The subject invention relates to a semiconductor package and method of manufacturing the same. The semiconductor package of the subject invention comprises a substrate with a through hole penetrating therethrough; a semiconductor chip positioned on the substrate covering the through hole; and a thermal conductive device filling the through hole and contacting the semiconductor chip. According to the subject invention, the thermal resistance in the structure of the semiconductor package is substantially reduced and thus desirable performance of heat spreading or dissipation is achieved. In addition, the production cost and size of the semiconductor package are also reduced.

9 Claims, 4 Drawing Sheets

U.S. PATENT DOCUMENTS

| | | | |
|---|---|---|---|
| 7,183,640 B2 * | 2/2007 | Mazzochette et al. | 257/703 |
| 7,262,440 B2 | 8/2007 | Choi et al. | |
| 7,274,105 B2 * | 9/2007 | Fairchild et al. | 257/774 |
| 7,285,802 B2 * | 10/2007 | Ouderkirk et al. | 257/98 |
| 7,312,525 B2 * | 12/2007 | Tatt et al. | 257/704 |
| 7,329,942 B2 | 2/2008 | Tsou et al. | |
| 7,345,350 B2 * | 3/2008 | Sinha | 257/449 |
| 7,381,905 B2 * | 6/2008 | Yoshioka | 174/262 |
| 7,491,895 B2 * | 2/2009 | Usui et al. | 174/262 |
| 7,505,109 B2 * | 3/2009 | Cheng et al. | 349/161 |
| 7,532,479 B2 * | 5/2009 | Ohno et al. | 361/719 |
| 7,608,904 B2 * | 10/2009 | Sinha | 257/449 |
| 7,838,417 B2 * | 11/2010 | Lopez | 438/640 |
| 7,898,811 B2 * | 3/2011 | Storey | 361/719 |
| 2004/0045656 A1 * | 3/2004 | Horng et al. | 156/89.11 |
| 2007/0018312 A1 | 1/2007 | Jo | |
| 2008/0191337 A1 * | 8/2008 | Cho | 257/684 |
| 2009/0072383 A1 | 3/2009 | Nakagoshi | |
| 2009/0260858 A1 * | 10/2009 | Nakai et al. | 174/252 |
| 2011/0056734 A1 * | 3/2011 | Andrews et al. | 174/260 |
| 2011/0169042 A1 * | 7/2011 | Wu et al. | 257/99 |

FOREIGN PATENT DOCUMENTS

| | | | |
|---|---|---|---|
| JP | 2002162626 A | * | 6/2002 |
| JP | 2003282778 A | * | 10/2003 |

* cited by examiner

SEMICONDUCTOR PACKAGE AND METHOD OF MANUFACTURING THE SAME

FIELD OF THE INVENTION

The invention relates generally to a semiconductor package and, more particularly, to an optoelectronic semiconductor package having a heat spreading structure.

BACKGROUND OF THE INVENTION

In a typical optoelectronic component or module, the issue concerning thermal spreading substantially affects the efficiency and reliability of the component or module. As known in the art, high thermal resistance in the structure of the component or module results in poor thermal performance. Usually, the problem concerning high thermal resistance was caused by materials or interfaces formed in the structure of the component or module.

FIG. 1 is a side cross-sectional view illustrating the structure of a conventional optoelectronic semiconductor package 100, which comprises a substrate 110, an optoelectronic semiconductor chip 111, a joint layer 112, a bonding metal 113, and an isolation layer 114. The conventional semiconductor package 100 is manufactured by processes as follows: providing a substrate 110; depositing an isolation layer 114 over the upper surface of the substrate 110; forming a bonding metal 113 on the isolation layer 114; forming a joint layer 112 over the bonding metal 113; and positioning the optoelectronic semiconductor chip 111 on the joint layer 112 so as to mount the optoelectronic semiconductor chip 111 onto the substrate 100. Ag-epoxy or solder is generally used as the material of the joint layer 112 and Ag (silver), Cu (Copper), or Al (Aluminum) is generally used as the material of the boding metal 113 when the solder related material using as joint material. The substrate 110 may be a MCPCB (Metal Core PCB) substrate, which is made of Al or Cu. Alternatively, the substrate 110 may be made of silicon, ceramic, or polymers. The isolation layer 114 is made of epoxy or polymer or silicon dioxide to isolate the metal circuit from the substrate 110 when a semi-conductor based substrate, e.g., silicon substrate, or metal based substrate, e.g., Al or Cu substrate, is used. The structure of the semiconductor package 100 is fabricated by conventional deposition processes which are well-known in the technical field of semiconductor fabricating processes, hence the detailed manufacturing processes are omitted here for brevity.

As shown in FIG. 1, it can be noted that there are many heat spreading barriers (joint layer 112, isolation layer 114, and the substrate 110 made of silicon, ceramic, or polymers) in the traditional package structure for the optoelectronic device such that heat can not be spread and dissipated rapidly and efficiently. Therefore, a new semiconductor package structure is needed so as to address the above-mentioned drawbacks.

In the issued U.S. Pat. No. 6,730,533, entitled "Plastic Packaging of LED Arrays," a method of forming a flexible circuit module is provided. The method comprises forming a conductive interconnect pattern having a first portion over a second side of the flexible module base and a plurality of second portions extending through the flexible module base toward the at least one rigid carrier. However, satisfying heat spreading performance cannot be achieved merely by the conductive interconnect pattern LED and flexible substrate disclosed in this patent.

In another issued U.S. Pat. No. 6,964,877, entitled "LED Power Package," a thermal conduction path for thermally conducting heat from the flip-chip bonded LED dice to the solderable backside of the electrically insulating sub-mount wafer is provided. As shown in FIG. 9 of this prior art, the solder related material, which is considered to be a heat spreading barrier, is disposed in the thermal conduction path, hence the performance of thermal conduction in the structure is still need to be improved.

U.S. Pat. No. 6,966,674, entitled "Backlight Module and Heat dissipation Structure thereof," also describes a heat dissipation structure for a backlight module comprising a circuit board having a through hole with a light emitting diode (LED) corresponding thereto, disposed on one side of the circuit board. The structure comprises a thermal conductive element disposed between the heat conducting portion and the LED, the thermal conducting element is made of a soft material that is not damaging to the LED. Since there is still a heat spreading barrier (the soft thermal conductive pad or paste) between LED and thermal conducting elements, satisfying performance of heat spreading is not achieved.

In another issued U.S. Pat. No. 7,262,440, entitled "Light Emitting Diode Package and Fabrication Method thereof," a light emitting diode package is proposed. The package comprises: a lower metal layer, a first silicon layer, a first insulation layer, a second silicon layer, a second insulation layer and a package electrode pattern; a spacer, an LED, and an optical element. Obviously, there are too many layers stacked between LED and the thermal conduction element so that too many heat barriers are created in the structure.

Moreover, U.S. Pat. No. 7,329,942, entitled "Array-type Modularized Light-emitting Diode Structure and a Method for Packaging the Structure," provides a method for packaging an array-type modularized light-emitting diode structure, in which the upper substrate is made from the material to have multiple arrayed dents and at least two through holes passing through the bottom of each dent, a conductive material is implanted in each through hole. However, as shown in the drawings and illustrated in the specification, the thermal element contacts merely the electrode such that the contacting area for spreading or dissipating heat is restricted. Therefore, desired heat spreading performance cannot be obtained.

In view of the above, among all these prior arts, at least one thermal barrier between LED and the thermal conductive element is disclosed. In addition, the discrete heat column/thermal via design only guides heat from the heat source to specific direction, which is insufficient for heat spreading. Moreover, all bonding materials (epoxy, silver epoxy, solder, etc.) between the optoelectronic element and the substrate would form the weak thermal contact and increase the thermal resistance.

Therefore, in order to reduce the thermal resistance in a package for a semiconductor chip, such as an optoelectronic device, and ensure desirable performance together with high reliability, there exists a need for an efficient heat spreading structure in a module or a package, which could be easily realized on any kinds of substrates by matured wafer-level or panel-level semiconductor fabricating process.

SUMMARY OF THE INVENTION

In one aspect, a semiconductor package with a heat spreading structure is provided. The semiconductor package comprises: a substrate with a through hole penetrating therethrough; a semiconductor chip positioned on the substrate covering the through hole; and a thermal conductive device filling the through hole and contacting the semiconductor chip.

In another aspect, a method of forming a semiconductor package is provided. The method comprises: providing a substrate with a through hole penetrating therethrough; mounting a semiconductor chip on the substrate, wherein the semiconductor chip covers the through hole; and filling a thermal conductive device in the through hole, wherein the thermal conductive device contacts the semiconductor chip.

These and other features, aspects, and embodiments are described below in the section entitled "Detailed Description of the Invention."

BRIEF DESCRIPTION OF THE DRAWING

Features, aspects, and embodiments are described in conjunction with the attached drawings, in which.

DETAILED DESCRIPTION OF THE INVENTION

Figure 1:
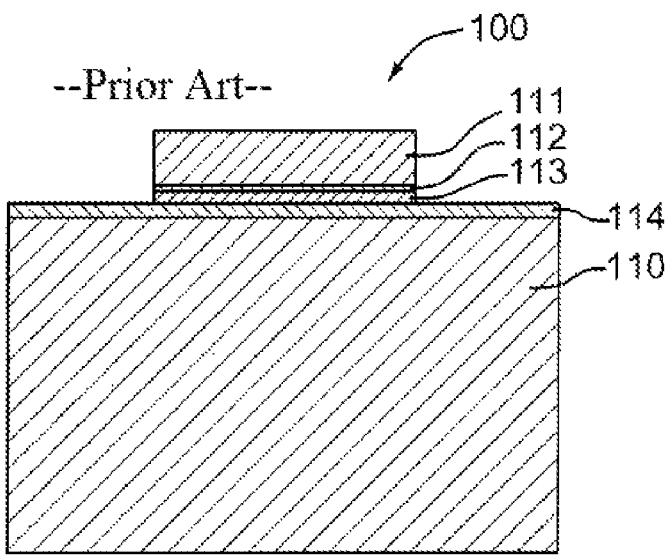
FIG. 1 is a side cross-sectional view illustrating the structure of a conventional package for an optoelectronic device.
Figure 2:
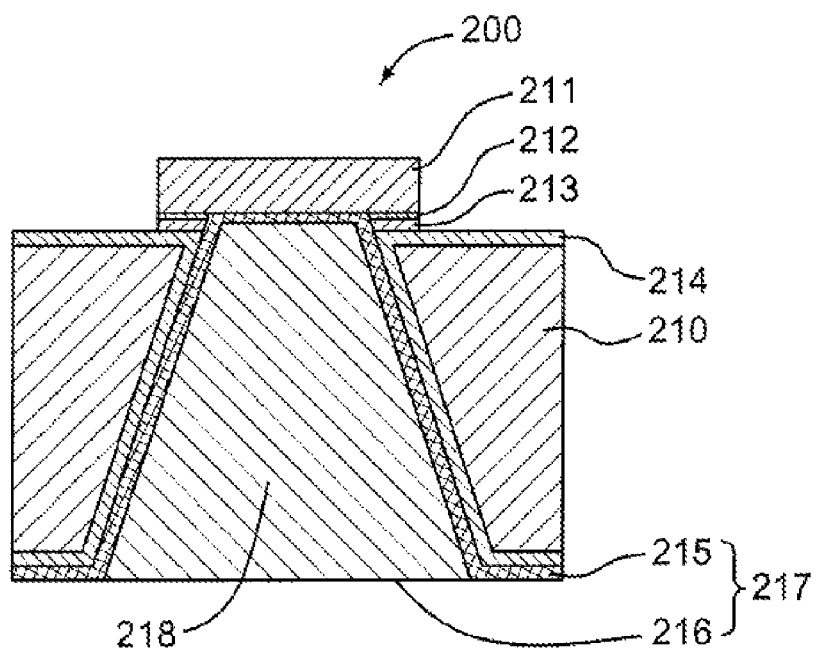
FIG. 2 is a side cross-sectional view illustrating the structure of the semiconductor package in accordance with the embodiment of the present invention.

FIG. 2 is a side cross-sectional view illustrating a semiconductor package with a heat spreading structure in accordance with the present invention.

Referring to FIG. 2, in a preferred embodiment of the present invention, the semiconductor package 200 comprises a substrate 210 with a through hole 218 penetrating therethrough, a semiconductor chip 211 positioned on the substrate 210 covering the through hole 218, and a thermal conductive device 217 filling in the through hole 218.

In another preferred embodiment, the through hole 218 can be of any shapes, such as circular, V-shaped etc. and formed in the substrate 210 by techniques such as chemical etching, mechanical drilling, or laser drilling. Generally, the substrate 210 can be made of semiconductor, organic-based material, ceramic based material, or other material suitable for the substrate in the technical field. The semiconductor chip 211 may be a Si-based IC, light emitting diode, compound-based solar cell, passive component, passive device, or other semiconductor device or electronic device. After the semiconductor chip 211 is mounted on the substrate 210, the thermal conductive device 217 is filled in the through hole 218 by for example sputtering, evaporation, electro-plating, electroless-plating process, or any other deposition process such that the thermal conductive device 217 contacts the semiconductor chip 211. Through the thermal conductive device 217, heat generated by the semiconductor chip 211 can be efficiently spread and dissipated.

In another preferred embodiment of the present invention, the thermal conductive device 217 includes a seed layer 215 and a thermal spreading element 216, and the semiconductor package 200 further comprises an isolation layer 214 formed on the substrate 200 and the through hole 218, a bonding material 213 formed on the isolation layer 214, a joint layer 212 formed on the boding material 213, wherein the joint layer 212 and the boding material 213 are stacked between the semiconductor chip 211 and the substrate 210.

In the embodiment, the isolation layer 214 may be made of silicon dioxide or epoxy or polymer so that the substrate 210 is electronically insulated from other elements in the semiconductor package 200 when a semi-conductor based substrate, e.g., silicon substrate, or metal based substrate, e.g., Al or Cu substrate, is used as the substrate 210. Isolation layer 214 is not necessary for organic or ceramic based substrate. The isolation layer 214 may be deposited by sputtering or evaporation or other deposition process. As shown in FIG. 2, the bonding material 213 is formed on the substrate 210 around an opening of the through hole 218 by general deposition process such as sputtering, evaporation, or plating or other deposition process. This bonding material 213 is needed when the solder based material is used as the joint layer 212. The joint layer 212 is formed on the bonding material 213 by printing or dispensing process for jointing the semiconductor chip 211 and the bonding material 213 together. Preferably, the joint layer 212 may be made of Ag-epoxy or solder and the bonding material may be made of Ag, Cu, or Al.

To facilitate the subsequent deposition of the thermal spreading element 216 for spreading and dissipating heat generated by the semiconductor chip 211, the seed layer 215 is preferably deposited over the isolation layer 214 in the through hole 218 and the bottom surface of the semiconductor chip 211. In the preferred embodiment, the seed layer 215 is an ultra thin seed layer having thickness for example only 1000 angstroms. The seed layer 215 can be formed by an ordinary deposition process which is known in the art such as sputtering, evaporation, printing, or electroless plating. The seed layer 215 will be used when the electro-plating process is used to form the thermal spreading element 216. Subsequently, the thermal spreading element 216 is then filled into the through hole 218 through depositing the material of the thermal spreading element 216 over the seed layer 215 by an ordinary deposition process such as electroplating, electroless plating, and printing, in which electroplating or electroless plating is preferred. Due to the existence of the seed layer 215, the initial growth of the thermal spreading element 216 could be of better quality, which means fewer defects would be formed. In order to achieve desirable performance of spreading heat generated by the semiconductor chip 211, the thermal spreading element 216 is preferably made of material with high thermal conductivity such as Cu, TiW, and Ag. Other highly conductive materials, for example Ag and Al, can also be employed as the material of the thermal spreading element 216. The seed layer 215 deposited for facilitating the subsequent growth of the thermal spreading element 216 can be made of a material homogeneous or heterogeneous to the material of the thermal spreading element 216. In the embodiment according to the present invention, since the thermal conductive device 217 directly contacts the semiconductor chip 211 without any high thermal resistant materials interposed in the thermal spreading path between the semiconductor chip 211 and the thermal conductive device 217, the thermal resistance in a package is reduced and heat can be conducted to the thermal conductive device 217 more directly and efficiently. Finally, if needed, the bottom surface of the thermal spreading element 216 filled in the through hole 218 can be polished by conventional physical or chemical polishing processes so that the excess portion of the thermal spreading element 216 is removed and bottom surface of the thermal spreading element 216 is flat.

Although it is not shown in FIG. 2, it is appreciated that due to the physical property of the wetted solder employed as the material of the joint layer 212 in the structure of the semiconductor package 200 according to the present invention, when the semiconductor chip 211 is mounted on the substrate by utilizing the joint layer 212, the surface at the corner of the through hole 218, i.e., at the edge of the joint layer 212 near the through hole 218, will be smooth such that there will be no void formed at the corner in the subsequent deposition process. Meanwhile, electroless process utilized as the deposition process can solve the problem of discontinuous deposition of the seed layer 215.

Figure 3:
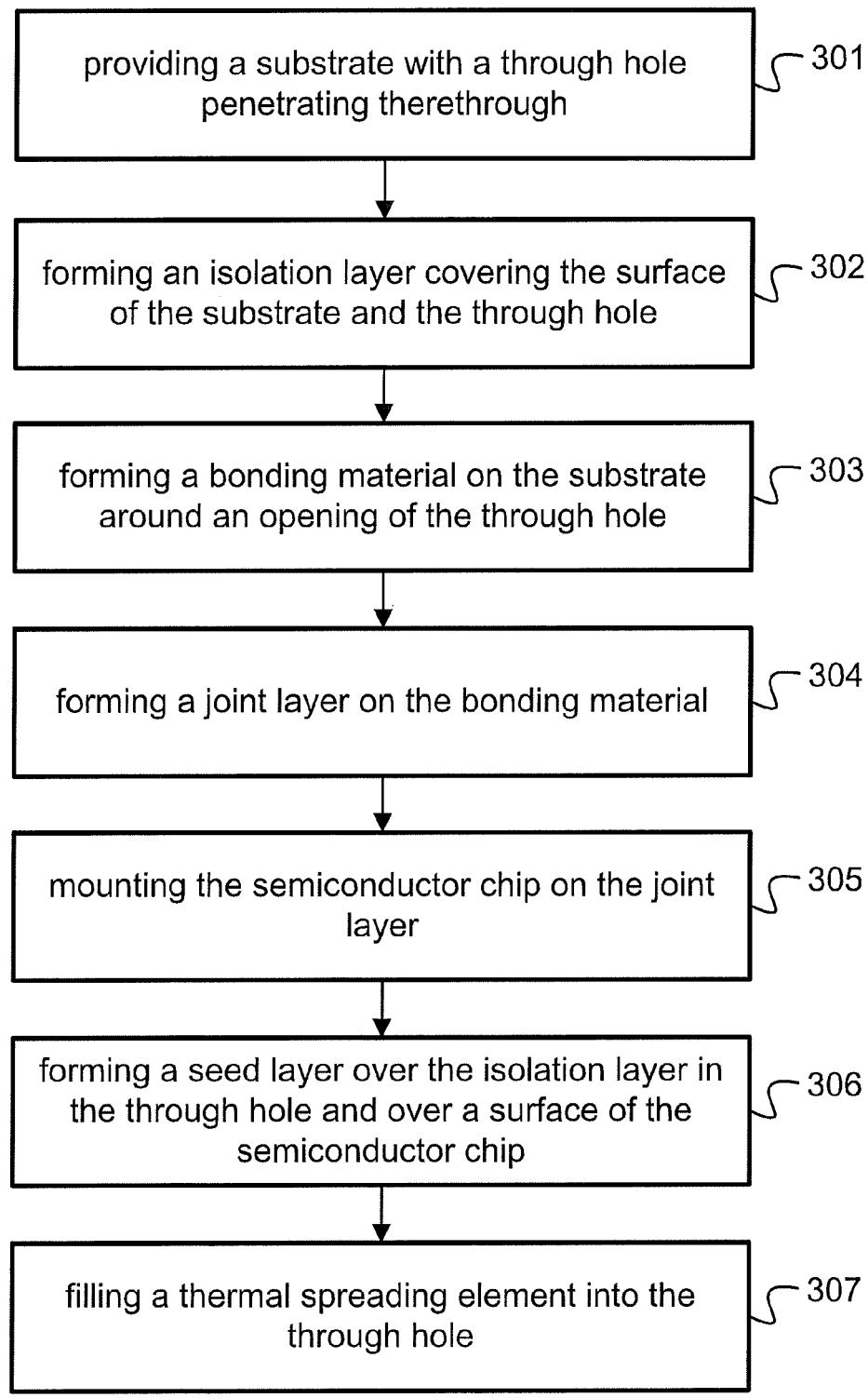
FIG. 3 shows a flowchart of manufacturing the semiconductor package according to the embodiment of the present invention.

FIG. 3 is a flowchart showing the manufacturing process of the semiconductor package in accordance with an embodiment of the present invention. The manufacturing process comprises the following steps: providing a substrate with a through hole penetrating therethrough (step 301); forming an isolation layer covering the surface of the substrate and the through hole by an ordinary deposition process as mentioned above (step 302); forming a bonding material on the substrate around an opening of the through hole (step 303) by an ordinary deposition process as mentioned above; forming a joint layer on the bonding material around the opening of the through hole by printing or dispensing process (step 304); mounting the semiconductor chip on the joint layer (step 305); forming a seed layer over the isolation layer in the through hole and over a surface of the semiconductor chip by, for example, sputtering, evaporation, or electroless plating process, as mentioned above (step 306); and filling a thermal spreading element into the through hole by a deposition process such as electroplating and electroless plating process, as mentioned above (step 307).

Figure 4A:
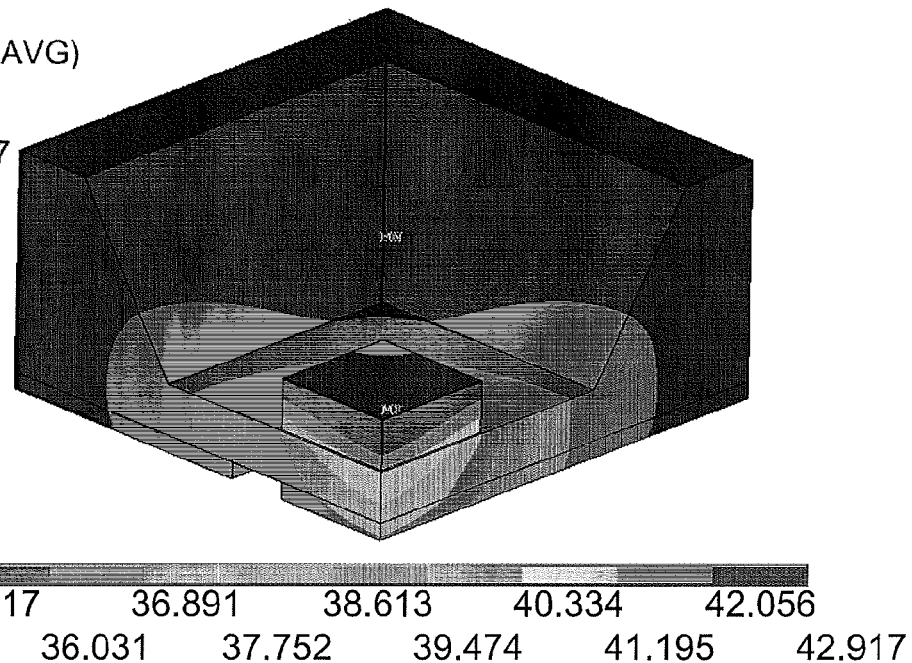
FIG. 4A and FIG. 4B are diagrams showing the temperature distribution near the optoelectronic device in a conventional package and in the semiconductor package according to the present invention, respectively.
Figure 4B:
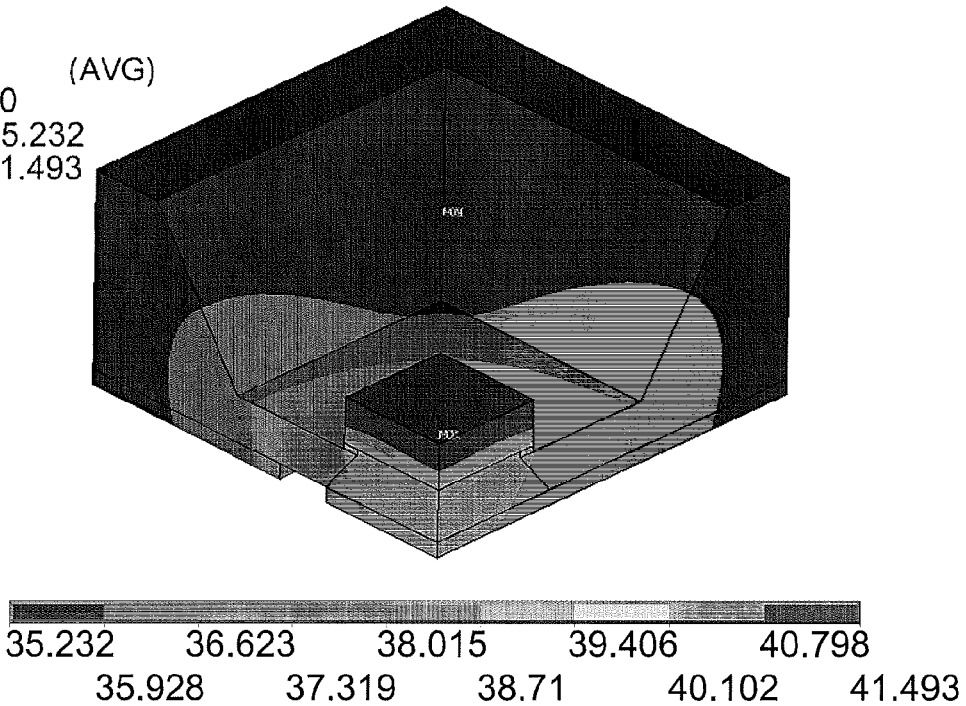

FIG. 4A and FIG. 4B are diagrams showing the temperature distribution near the LED device by computer aided simulation. FIG. 4A is a temperature distribution diagram for HyLED™ of Hymite and FIG. 4B is a temperature distribution diagram for the package according to the present invention. In FIG. 4A and FIG. 4B, different color represents different temperature, as indicated by the color bar below the two figures. In comparison, as shown in FIG. 4A and FIG. 4B, it can be noted that the temperature near the LED device in the package according to the present invention is lower than the temperature near the LED device in the known HyLED™ of Hymite.

Figure 5:
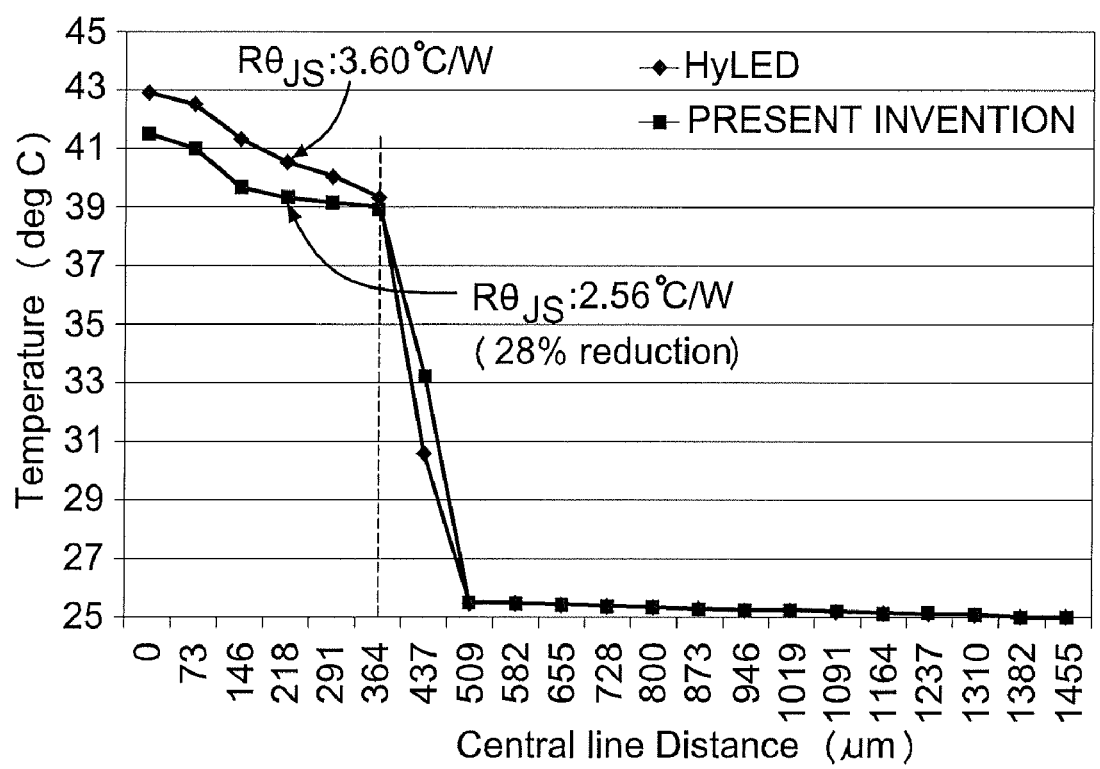
FIG. 5 is a line chart showing the relations between temperature and the distance from the central line of the semiconductor chip in the conventional package and in the semiconductor package according to the present invention, respectively.

FIG. 5 is a line chart showing the relations between the temperature and the distance from the central line of each of the LED devices in FIG. 4A and FIG. 4B, wherein the temperature is measured in Celsius degree (deg C) and the distance is measured in micrometers (m). In FIG. 5, the line marked by the rhombuses shows the temperature at different distances from the central line of conventional HyLED™ as shown in FIG. 4A and the line marked by the squares shows the temperature at different distances from the central line of the LED package according to the present invention as shown in FIG. 4B; in addition, $R_{\theta js}$ represents the thermal resistance (from junction to solder) measured in ° C./W. Referring to FIG. 5, it is noted that the thermal resistance near the central line of the device is substantially reduced in the package in accordance with the present invention. More specifically, as indicated in FIG. 5, the thermal resistance is reduced to 2.56° C./W. Compared with HyLED™ having thermal resistance value 3.60° C./W, it is found that the package in accordance with the present invention actually has about 28 percents reduction in thermal resistance value.

There are many advantages provided by the embodiments according to the present invention. First, the thermal resistance in the structure of the semiconductor package is substantially reduced and desirable performance of heat spreading or dissipation is achieved. Furthermore, since the structure can be easily realized by matured wafer-level or panel-level process on different kinds of substrate, the production cost of the package may also be reduced. Moreover, wafer-based lithography techniques are introduced in the present invention; therefore, the size of the LED module can be reduced as well.

While certain embodiments have been described above, it will be understood that the embodiments described are by way of example only. Accordingly, the device and methods described herein should not be limited to the described embodiments. Rather, the device and methods described herein should only be limited in light of the claims that follow when taken in conjunction with the above description and accompanying drawings.

What is claimed is:

1. A semiconductor package, comprising:
   a substrate with a through hole penetrating therethrough, the through hole having an opening on an upper surface of the substrate;
   a semiconductor chip positioned on the upper surface of the substrate and covering the through hole;
   a bonding layer formed between the substrate and the semiconductor chip and around the opening of the through hole; and
   a thermal conductive device filling the through hole and directly contacting the semiconductor chip and the bonding layer.

2. The semiconductor package according to claim 1, wherein the substrate is made of at least one of semiconductor, organic-based material, metal-based material, and ceramic-based material.

3. The semiconductor package according to claim 1, wherein the substrate further comprises an isolation layer covering the through hole and the upper surface of the substrate, the bonding layer being formed between the isolation layer and the semiconductor chip.

4. The semiconductor package according to claim 1, wherein the semiconductor chip comprises at least one of Si-based IC, light emitting diode, compound-based solar cell, and passive component and device.

5. The semiconductor package according to claim 1, further comprising a bonding material positioned between the semiconductor chip and the substrate, wherein the bonding material comprises at least one of Ag, Cu, and Al.

6. The semiconductor package according to claim 5, further comprising a joint layer positioned between the semiconductor chip and the bonding material, wherein the joint layer is made of at least one of organic material, metal-polymer mixture, and alloy paste.

7. The semiconductor package according to claim 3, wherein the thermal conductive device comprises a thermal spreading element and a seed layer, wherein the seed layer is positioned between the isolation layer and the thermal spreading element and between the semiconductor chip and the thermal spreading element.

8. The semiconductor package according to claim 7, wherein the seed layer is made of a material heterogeneous or homogeneous to the thermal spreading element, and the material comprises at least one of Cu, TiW, Ag, and other high conductive material.

9. The semiconductor package according to claim 1, wherein the thermal conductive device comprises a seed layer and a thermal spreading element, the seed layer disposed over a bottom surface of the semiconductor chip and the thermal spreading element being filled into the through hole through depositing material of the thermal spreading element over the seed layer.

* * * * *